United States Patent [19]

Parks

[11] 3,813,773

[45] June 4, 1974

[54] METHOD EMPLOYING PRECISION STAMPING FOR FABRICATING THE WAFERS OF A MULTIWAFER ELECTRICAL CIRCUIT STRUCTURE

[75] Inventor: Howard Lee Parks, Woodland Hills, Calif.

[73] Assignee: Bunker Ramo Corporation, Oak Brook, Ill.

[22] Filed: Sept. 5, 1972

[21] Appl. No.: 286,163

[52] U.S. Cl. .................... 29/630 R, 29/625, 29/627, 29/629

[51] Int. Cl. .............................................. H01r 9/00

[58] Field of Search ............. 29/624, 625, 626, 627; 174/630, 88, 68.5, 35 R, 36; 317/101 C, 101 CM, 101 D, 101 CP

[56] References Cited

UNITED STATES PATENTS

| | | | |
|---|---|---|---|
| 2,948,051 | 8/1960 | Eisler | 174/68.5 |
| 3,077,658 | 2/1963 | Wharton | 174/68.5 |
| 3,351,702 | 11/1967 | Stephens | 29/624 |
| 3,351,816 | 11/1967 | Sear et al. | 174/68.5 |
| 3,351,953 | 11/1967 | Sear | 174/68.5 |
| 3,499,219 | 3/1970 | Griff et al. | 174/68.5 |
| 3,541,222 | 11/1970 | Parts et al. | 29/625 |
| 3,559,285 | 2/1971 | Kauffman | 29/626 |
| 3,705,332 | 12/1972 | Parks | 317/101 CM |

*Primary Examiner*—Charses W. Lanham
*Assistant Examiner*—James R. Duzan
*Attorney, Agent, or Firm*—F. M. Arbuckle; N. Cass

[57] ABSTRACT

A low-cost method employing precision stamping for fabricating the wafers of a multiwafer electrical circuit structure comprised of a plurality of electrically conductive wafers stacked together under pressure. A stack is normally comprised of conductive wafers of different types including component wafers, interconnection wafers, and connector wafers which are fabricated to provide X, Y and Z-axis coaxial connections between components in the stack. In accordance with the present invention, these X, Y and Z coaxial connections are fabricated directly from the wafer material itself at relatively low cost as compared to known methods as a result of the employment of a novel combination of precision stamping, dielectric filling and sanding or etching steps.

17 Claims, 11 Drawing Figures

METHOD EMPLOYING PRECISION STAMPING FOR FABRICATING THE WAFERS OF A MULTIWAFER ELECTRICAL CIRCUIT STRUCTURE

BACKGROUND OF THE INVENTION

Field of the Invention

This invention relates to an improved method for fabricating the wafers of a multiwafer electrical circuit packaging structure.

Considerable effort has been expended in recent years in an attempt to optimize the packaging of complex high speed electronic systems which may incorporate several active semiconductor circuit chips. The design ojbectives of these packaging efforts have been, among other things, to maximize the utilization of space, provide a high degree of reliability, provide wide bandwidth interconnections usable at high frequencies, minimize cross talk, and assure adequate heat removal, while at the same time providing economical methods of fabrication.

The following U. S. patents and patent applications, all assigned to the assignee of the present application, disclose various related structures and fabrication methods for electronic packaging:

Pat. Nos. 3,351,702; 3,351,816; 3,351,953; 3,499,219; Ser. No. 7,746, filed Feb. 2, 1970; and Ser. No. 248,003, filed Apr. 27, 1972.

SUMMARY OF THE PRESENT INVENTION

In accordance with the present invention, an improved, low-cost method is disclosed for fabricating the wafers of a multiwafer packaging structure typically comprised of one or more electrically conductive plates or wafers stacked together to form a parallelpiped structure containing one or more active components (e.g., integrated circuit chips) as well as conductor means providing coaxial interconnections in X, Y and Z-axis directions.

One of the most difficult problems presented in fabricating a stacked conductive wafer structure involves the provision of reliable Z-axis interconnections, not only within a wafer, but most particularly where a Z-axis interconnection has to be carried through many wafers. These problems are made even more difficult where low cost is an important aim of the resulting packaged structure. Accordingly, an important object of the invention resides in the manner in which an improved method is provided for obtaining reliable Z-axis interconnections as well as reliable X and Y-axis interconnections for a packaged multiwafer structure at relatively low cost by taking advantage of precision die stamping in a novel manner.

The specific nature of the invention as well as other objects, advantages, features and uses thereof will become apparent from the following disclosure of a preferred embodiment.

Figure 1:
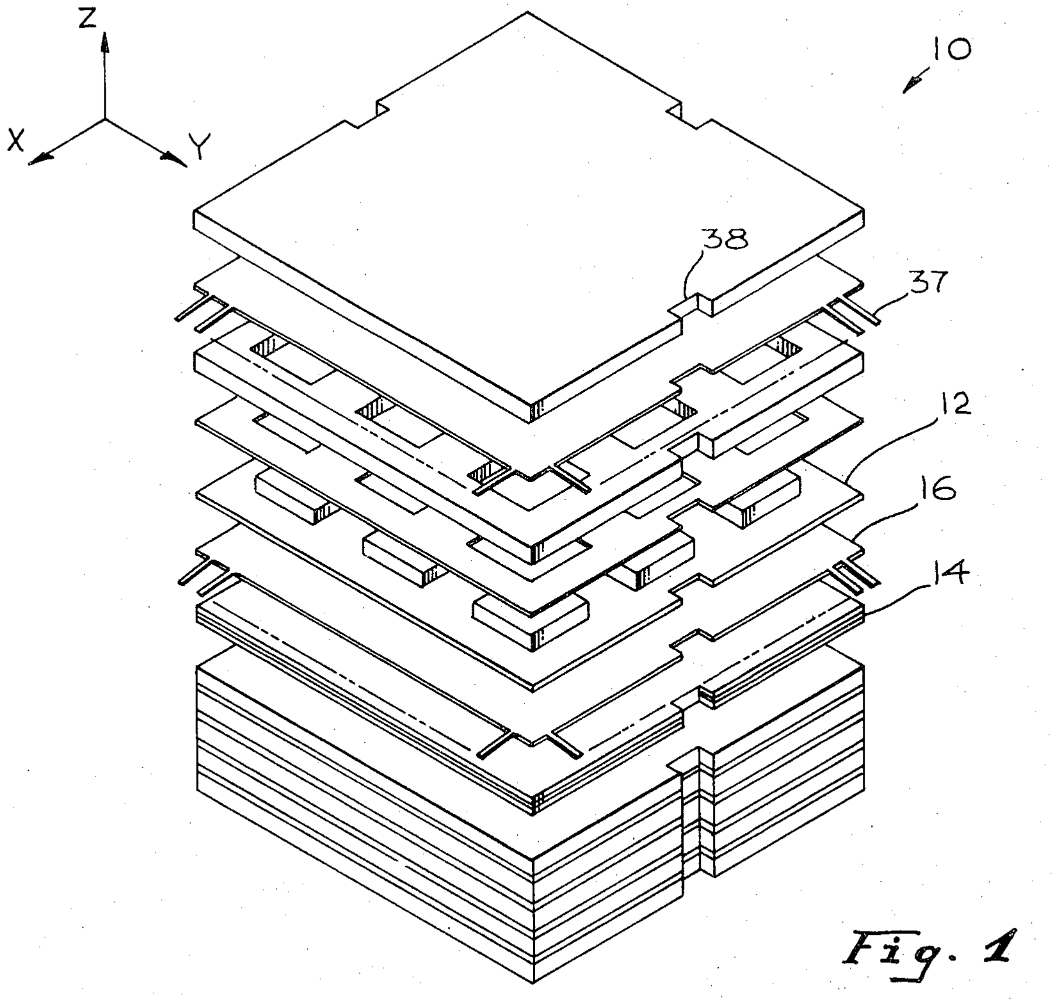
FIG. 1 is a perspective view of a disassembled multiwafer electrical circuit structure which may be fabricated using the method of the present invention.

Attention is now called to FIG. 1 which illustrates a partially dissembled multiwafer electrical circuit structure which may be fabricated in accordance with the present invention. Such an electrical circuit structure is implemented by stacking a multiplicity of conductive wafers fabricated so as to cooperate with one another to form desired coaxial connections in X, Y and Z-axis directions. The wafer stack 10 illustrated in FIG. 1 is comprised of a plurality of different wafers which essentially fall into the following three classes: component wafers 12, interconnection wafers 14, and connector wafers 16. As will be seen hereinafter, a component wafer is used to physically support and provide electrical connection to active circuit devices such as integrated circuit chips, LSI chips, etc. Each component wafer provides means for connecting the terminals of the active device to Z-axis conductors or slugs for interconnection to adjacent wafers. The interconnection wafers 14 are fabricated so as to include Z-axis slugs as well as X—Y conductors extending in the plane of the wafer. The connector wafers 16 provide a uniform matrix of Z-axis slugs forming through-connections for providing wafer-to-wafer interconnections.

The multiwafer structure of FIG. 1 is formed by stacking appropriately designed wafers under pressure so as to enable connector wafer Z-axis slugs to connect to slugs aligned therewith in adjacent wafers. In this manner electrical interconnections are formed from wafer to wafer enabling desired circuit points to be made available external to the stack.

As will be discussed in greater detail hereinafter, the coaxial X, Y and Z interconnections are typically provided in the structure of FIG. 1 by working each of the conductive (e.g., copper) wafers so as to form the required X, Y and Z-axis conductors within the profile of the wafer by isolating selected portions of islands from the remainder of the wafer material. The isolated portion or island is physically supported by the wafer and electrically insulated therefrom by dielectric material introduced to replace the removed wafer material.

Figure 2:
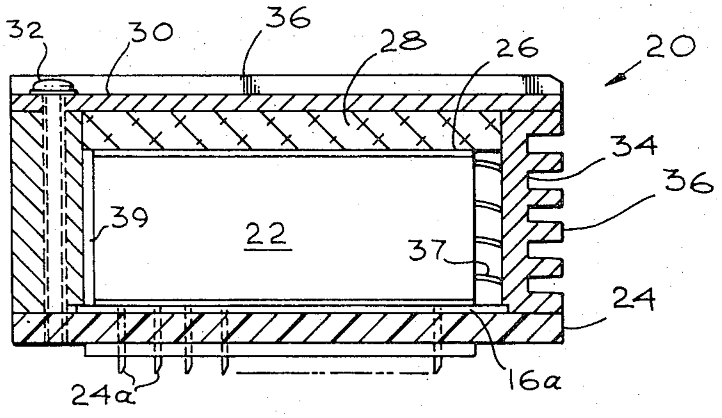
FIG. 2 is a sectional view illustrating how the multiwafer structure of FIG. 1 may typically be pressure-stacked within a suitable housing.

Prior to discussing the internal details of the wafer structures and a preferred method of fabricating the wafers in accordance with the invention, attention is called to FIG. 2 which illustrates how the wafer stack 10 of FIG. 1 may typically be mounted within a suitable metallic housing 20. More particularly, FIG. 2 illustrates a wafer stack 10 mounted in the housing 20 between a connector block 24 and a top pressure plate 26. The connector block 24 contains insulated through-conductor output terminal pins 24*a* electrically coupled to the stack 10 by an output connector wafer 16*a* so as to thereby permit convenient electrical connection of the stack and housing to external electrical circuitry. The stack is held under pressure in the Z-axis direction by a resilient pressure pad 28 bearing against the plate 26. The pressure pad 28 is held compressed by a cover plate 30 secured by bolt 32. The cover plate 30 and the housing walls 34 are provided with spaced elongated fins 36 projecting perpendicularly outwardly therefrom. The fins 36, of course, function to maximize heat transfer from the housing 20 to the surrounding cooling medium. In order to provide good heat transfer from the stack 10 of FIG. 1 to the housing walls, a plurality of wafers, such as the connector wafers, are provided with resilient fingers 37 preferably formed integral with the wafers, extending outwardly from the wafer periphery. Upon insertion of the stack into the housing, the fingers contact the inner surface of the housing walls, as shown in FIG. 2, to thus provide a good heat transfer path thereto. In order to laterally align the stack 10 in the housing 20, the wafers are provided with keyways 38 (FIG. 1) adapted to mate with key projections 39.

As previously pointed out, all the wafers can be considered as falling into three types; namely the component wafers 12, the interconnection wafers 14, and the connector wafers 16. All of the wafers are basically quite similar in construction inasmuch as each essentially comprises a wafer of conductive material such as copper having portions within the profile thereof isolated electrically from the remainder of the wafer so as to provide the required X, Y and Z interconnections.

Figure 3:
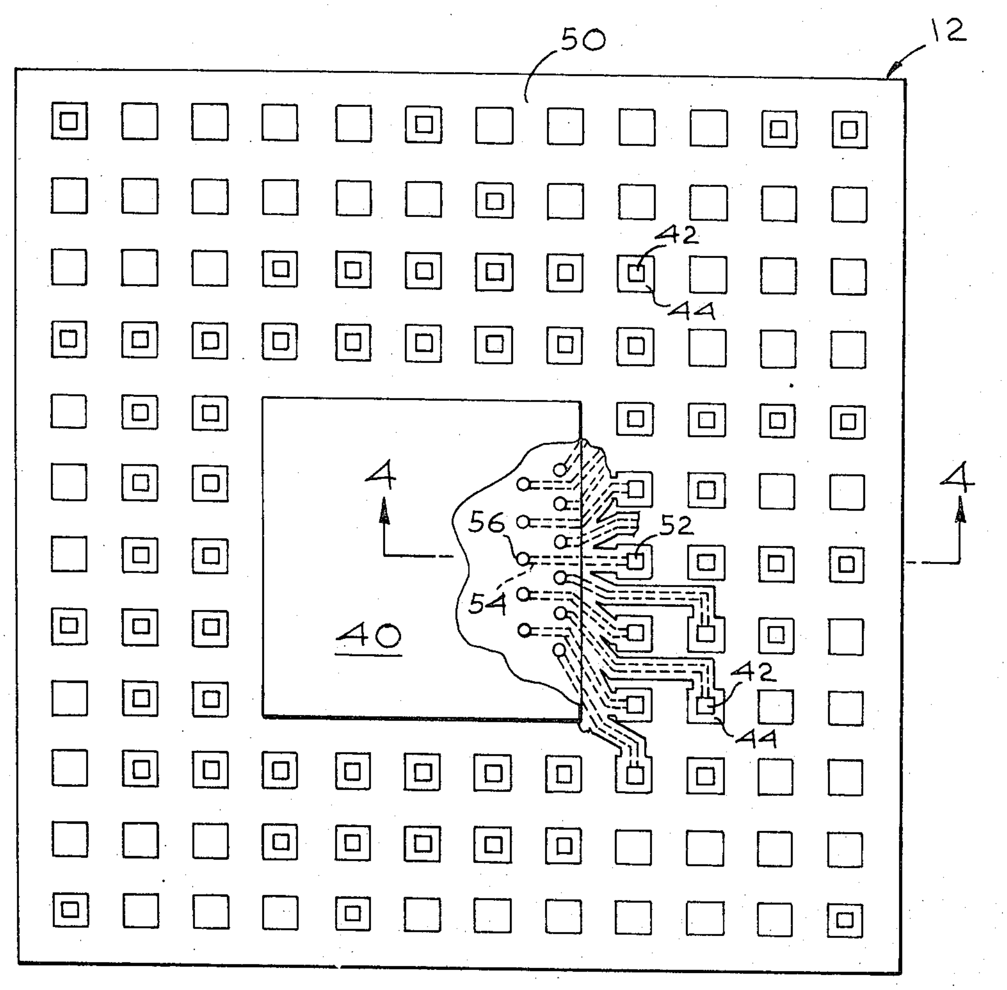
FIG. 3 is a fragmentary plan view illustrating a portion of a component wafer which may be fabricated using the method of the present invention.
Figure 4:
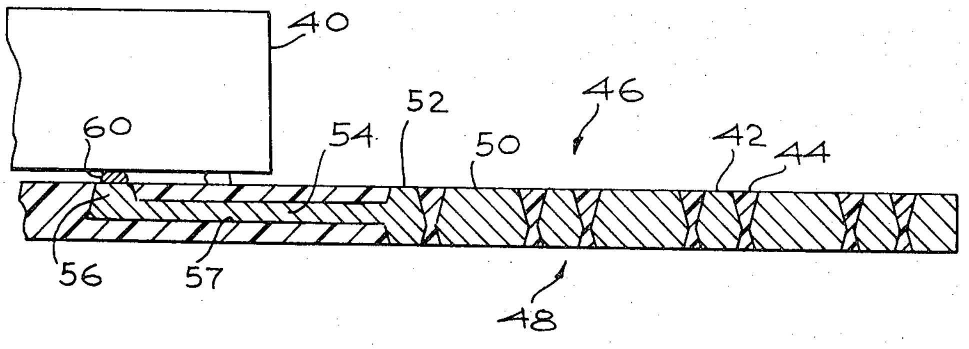
FIG. 4 is a sectional view taken substantially along the plane 4—4 of FIG. 3.

FIGS. 3 and 4 illustrate a portion of a component wafer 12 showing an active device chip 40 mounted thereon and connected thereto. The component wafer 12 has a plurality of Z-axis slugs 42 formed within the profile thereof, each slug 42 constituting an island isolated from the remainder of the wafer by dielectric material 44 disposed within an opening formed in the wafer extending between, and exposed at, the top surface 46 and the bottom surface 48 thereof. That is, each slug 42 shown in FIGS. 3 and 4 can be considered as being supported within an opening extending through the wafer by dielectric material 44 which both supports and electrically isolates the slug from the remaining wafer material 50. The slugs 42 shown in FIGS. 3 and 4 are preferably arranged in a uniform rectangular matrix, for example, on 50 mil centers in both the X and Y-axis directions.

The active device 40 is a conventional device provided with a plurality of terminals and it is, of course, essential to be able to connect each of the active device terminals to a different Z-axis slug 42 in the component wafer 12. In order to connect each of the device terminals to a different Z-axis slug, the wafer 12 is formed so as to provide an area thereof, corresponding in shape to the shape of the active device 40, in which X–Y conductors extending within the plane of the wafer from a plurality of Z-axis slugs, terminate. Note, for example, slug 52 which is electrically connected to an X–Y conductor 54 extending in the plane of the wafer and terminating at terminal point 56 in the area of the wafer where the device 40 is to be mounted. As noted, the slug 52 extends between and is exposed at the top and bottom wafer surfaces 46 and 48. The X–Y conductor 54 connected thereto is elongated in the plane of the wafer between and recessed from the top and bottom surfaces 46 and 48 and terminates beneath the device 40 in the terminal point 56 which extends to and is exposed at the top wafer surface 46. Dielectric material 57 surrounds the slug 52, conductor 54 and terminal 56 to electrically isolate them from the remaining wafer material. Conductive material 60, such as a small portion of solder, interconnects the terminal point 56 to a terminal on the device 40.

It should be appreciated that the slug 52 constitutes a central conductor surrounded by the conductive wafer material 50 but isolated therefrom by dielectric material so as to constitute a coaxial conductor. As will be fully appreciated hereinafter, in the resulting stacked circuit structure of FIG. 1, the X–Y conductors 54 within each wafer will also form central conductors of coaxial interconnections, since each will be coaxially shielded by the remaining material of the wafer in whose profile it lies and material of adjacent wafers above and below in the stack. In other words, the number, size, and spacings of the Z-axis slugs and the X–Y conductors in the various wafers are chosen with respect to the operating frequency range intended for the structure so that all of the interconnections within a stack, that is within the wafers as well as between wafers, effectively constitute coaxial interconnections.

Figure 5:
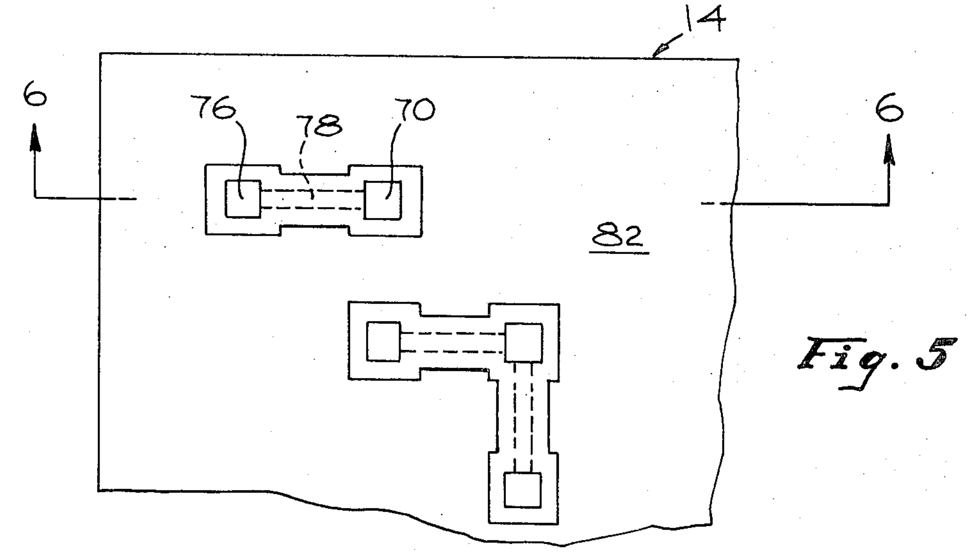
FIG. 5 is a fragmentary plan view illustrating a portion of an interconnection wafer which may be fabricated using the method of the present invention.

Attention is now directed to FIG. 5 which illustrates a fragmentary portion of an interconnection wafer 14 which, as previously noted, functions to define X–Y as well as Z-axis interconnections. The interconnections are formed in the wafer 14 similarly to the previously discussed interconnections formed in the wafer 12. Thus, a typical wafer 14 defines a plurality of Z-axis slugs 70 extending between the top surface 72 and the bottom surface 74 of wafer 14. The Z-axis slug 70 is interconnected with another Z-axis slug 76, for example, by a recessed X–Y conductor 78. As was described in conjunction with FIGS. 3 and 4, both the X–Y conductors and Z-axis slugs are surrounded by dielectric material 80 which provides electrical insulation to the remaining wafer material 82.

Figure 7:
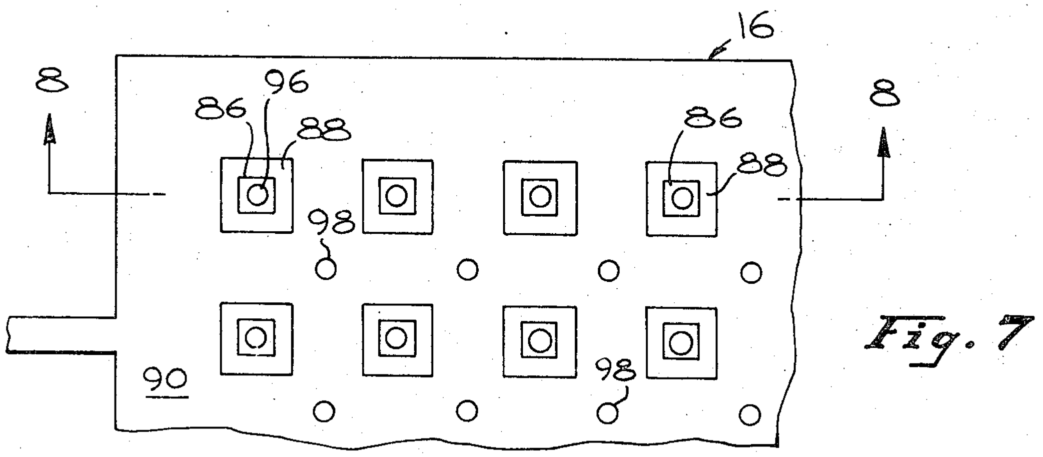
FIG. 7 is a fragmentary plan view illustrating a portion of a connector wafer which may be fabricated using the method of the present invention.
Figure 8:
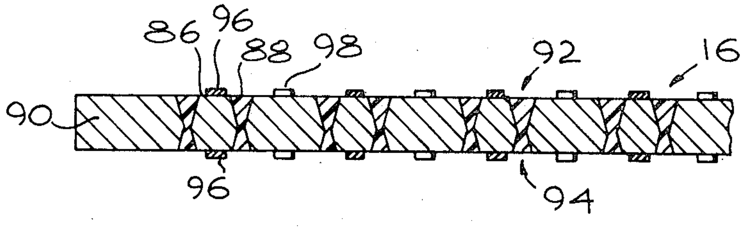
FIG. 8 is a sectional view taken substantially along the plane 8—8 of FIG. 7.

Attention is now called to FIGS. 7 and 8 which illustrate a connector wafer 16 which is formed to include a plurality of Z-axis slugs 86 preferably arranged in a uniform rectangular matrix. Each Z-axis slug 86 is completely surrounded by dielectric material 88 supporting the slug and electrically insulating it from the remainder of the wafer material 90. Each Z-axis slug 86 is exposed on the top and bottom wafer surfaces 92 and 94. Malleable contacts 96 are preferably provided on both ends of each of the slugs 86, i.e., at both the top surface 92 and the bottom surface 94. As will be seen hereinafter, alternate layers in the stack comprise connector wafers in order to provide Z-axis interconnections to wafers above and below which can constitute either interconnection or component wafers. The malleable contacts 96 are formed of more ductile material than the Z-axis copper slugs and so when the stack is placed under pressure within the housing 20 of FIG. 2, the contacts 96 are deformed by engagement with the aligned Z-axis slugs in adjacent wafers to thus form good interconnections between the wafers.

In addition to the contacts 96 formed on both surfaces of the connector wafers 16, similar malleable contacts 98 are provided on the remaining portion 90 of the wafer 16 in order to provide a good ground plane interconnection between wafers.

Figure 9:
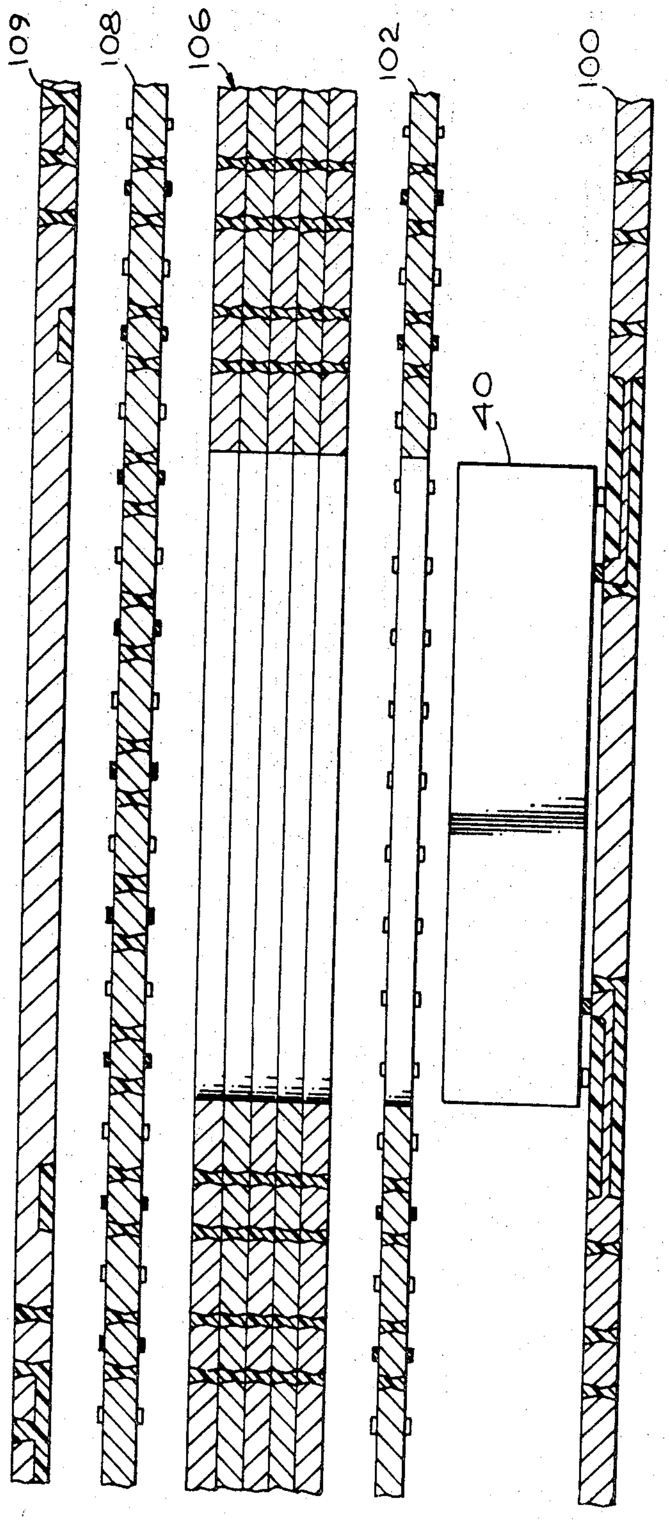
FIG. 9 is a sectional view illustrating a typical stack of component interconnection and connector wafers such as may be employed in the multiwafer structure of FIG. 1.

Attention is now directed to FIG. 9 which illustrates the cross-section of a typical stack 10 such as illustrated in FIG. 1 comprised of component wafers, connector wafers, and interconnection wafers. Note that the component wafer 100 illustrated in FIG. 9 is substantially identical to the component wafer illustrated in FIGS. 3 and 4. The connector wafer 102 illustrated in FIG. 9 is substantially identical to the connector wafer illustrated in FIGS. 7 and 8 except, however, that a portion 104 thereof has been cut out to provide clearance for the active device 40.

As shown in FIG. 9, a plurality of filler wafers 106 are stacked above the connector wafer 102 to equal the height of the active device 40. The filler wafers 106 are substantially identical to the connector wafers 102 in that they define a matrix organization of Z-axis slugs. A plurality of filler wafers can be fused together to form a composite wafer or alternatively, the filler wafers can be interconnected as a consequence of the Z-axis pressure provided by housing 20. In the latter case, the filler wafers 106 are selected so that only alternate layers contain malleable contacts in order to assure that Z-axis interconnections from one wafer to another are always formed between a malleable contact and the opposed face of an aligned Z-axis slug.

A standard connector screen 108 is shown stacked above the filler wafers 106 with an interconnection wafer 109 being stacked thereabove.

In order to assure high reliability interconnections between wafers, and in recognition of the fact that Z-axis pressure may not be appropriately transferred through portions of the stack in vertical alignment with the active devices, it is preferable that all required Z-axis interconnections be made in the region surrounding the active devices rather than in vertical alignment therewith.

Although the multiwafer structure of FIG. 1 is preferably formed of a stack of wafers wherein alternate wafers in the stack are provided with mealleable contacts to establish wafer-to-wafer interconnections, in certain situations i.e., with interconnection wafers as well as with filler wafers, it may be more expedient to fuse a group of wafers together to form a composite wafer. In such a case, it is then only necessary that a connector wafer be incorporated between the fused wafer group and the next adjacent wafer.

Figure 10:
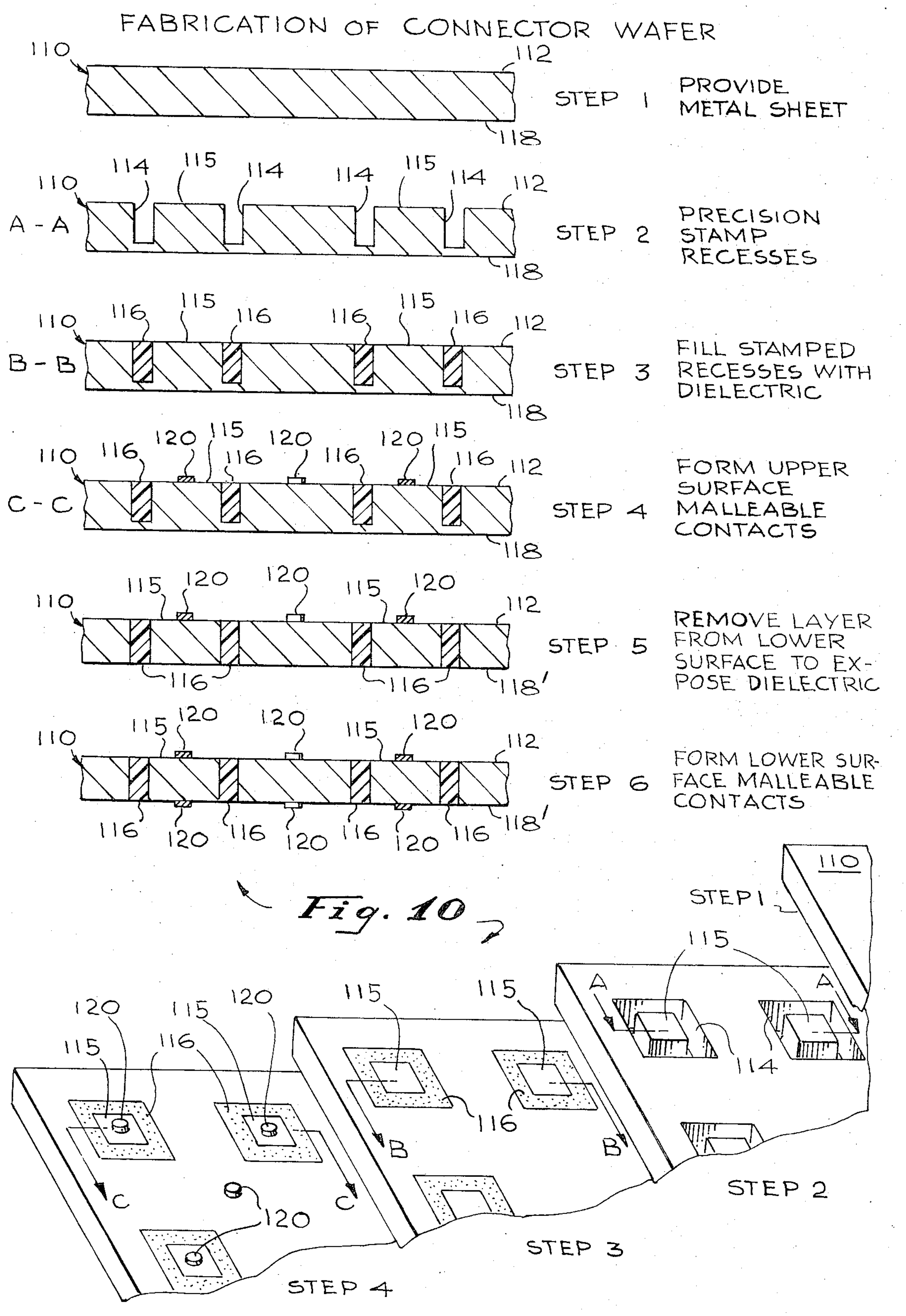
FIG. 10 is a multi-part diagram illustrating a preferred method of fabricating a connector wafer in accordance with the present invention.

Attention is next directed to FIG. 10 which illustrates a preferred method in accordance with the present invention for fabricating a connector wafer of the type illustrated in FIGS. 7 and 8.

As shown in step 1 of FIG. 10, a metal sheet or plate 110 of appropriate size and thickness is initially provided. The sheet 110 may typically be of beryllium copper.

As shown in step 2 of FIG. 10, precision stamping is employed to form recesses 114 in the top surface 112 of the sheet 110 so as to define a predetermined pattern of Z-slug segments 115 respectively corresponding to the pattern of Z-axis slugs to be formed in the connector wafer. Appropriate precision stamping techniques suitable for this purpose are well known.

As shown in step 3 of FIG. 10, the stamped recesses 114 are filled with dielectric material 116, such as a dielectric epoxy having appropriate mechanical and electrical properties. Any excess dielectric material is removed, such as by sanding.

As shown in step 4 of FIG. 10, malleable contacts 120 are then formed on each of the Z-slug segments 115 and also at intermediate locations of the upper wafer surface 112 in conformance with the connector wafer illustrated in FIGS. 7 and 8. These malleable contacts 120 may typically be formed using well known selective chemical etching and electroplating techniques.

As shown in step 5 of FIG. 10, a sufficient layer is removed from the bottom surface 118 of the sheet 110, such as by sanding or etching so as to provide a new lower surface 118' in which the dielectric material 116 is exposed, thereby electrically isolating each of the Z-slug segments 115 from the wafer. The thus isolated Z-slug segments 115 will then constitute the Z-axis slugs desired in the wafer.

As shown in step 6 of FIG. 10, malleable contacts 120 are then suitably formed on the other end of each Z-axis slug and also at appropriate intermediate locations of the lower surface 118' to thereby provide a resulting wafer construction corresponding to the connector wafer illustrated in FIGS. 7 and 8.

Figure 6:
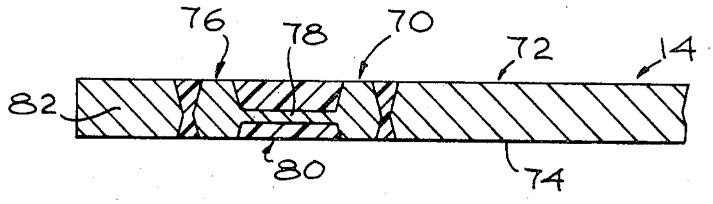
FIG. 6 is a sectional view taken substantially along the plane 6—6 of FIG. 5.
Figure 11:
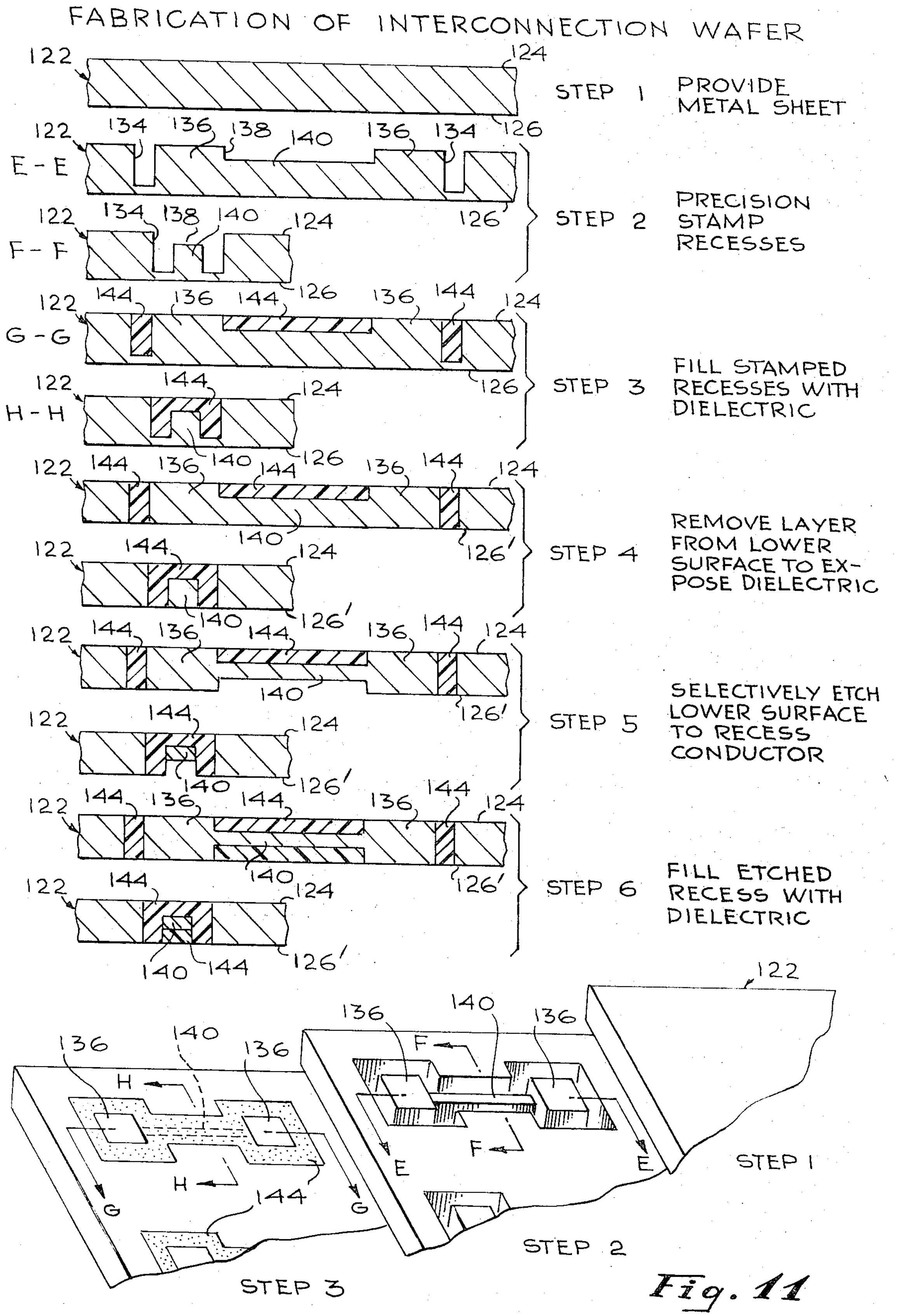
FIG. 11 is a multi-part diagram illustrating a preferred manner of fabricating an interconnection wafer in accordance with the present invention.

Referring now to FIG. 11, illustrated therein is a preferred method in accordance with the present invention for fabricating X and/or Y-axis conductors in a wafer along with Z-axis slugs, such as are required, for example, in the component wafer illustrated in FIGS. 3 and 4 and in the interconnection wafer illustrated in FIGS. 5 and 6.

As shown in step 1 of FIG. 11, a metal sheet 122 of appropriate size and thickness is initially provided, which may typically be of beryllium copper.

As shown in step 2 of FIG. 11, the upper surface 124 is precision stamped so as to form first recesses 134 defining the X, Y and Z-axis interconnection pattern to be formed in the wafer, and so as to also form second recesses 138 of lesser depth which determine the amount that the X and Y conductors are to be recessed below the top wafer surface 124. More specifically, it will be seen that the recesses 134 not only define the Z-slug segments 136 which are to constitute the Z-axis slugs of the wafer, but also define the widths of X and Y conductor segments 140 which are to constitute the X and Y-axis conductors to be provided in the wafer. The recesses 138 of lesser depth merely serve to define the uppermost surfaces of the X and Y conductor segments 140 and thus the amount they are recessed below the top wafer surface 124.

As shown in step 3 of FIG. 11, the recesses 134 and 138 are filled with dielectric material 144, any excess dielectric material being removed, such as by sanding.

As shown in step 4 of FIG. 11, a sufficient layer is removed from the bottom surface 126, such as by sanding or etching, so as to provide a new lower surface 126' in which the dielectric material 144 is exposed, thereby electrically isolating the Z-axis segments 136 as well as the X and Y conductor segments 140.

As shown in step 5 in FIG. 11, the lower surfaces of the X and/or Y conductor segments 140 are then recessed from the bottom surface 126', which may typically be accomplished by the use of selective chemical etching. The resulting X and Y conductor segments 140 will then be recessed from both surfaces of the wafer and along with the Z-slug segments 136, will then correspond to the X, Y and Z interconnections illustrated for the component and interconnection wafers in FIGS. 3–6.

As shown in step 6 of FIG. 11, the recesses etched in the X and/or Y conductor segments 140 during step 4 may be filled with dielectric material 144, although this is not necessary in most applications, since the previously provided dielectric material 144 is ordinarily sufficient to provide adequate support and electrical isolation.

In a typical embodiment, the housing 20 shown in FIG. 2 may have a vertical dimension on the order of 1.6 inches with the width and depth of the housing each being about 2.7 inches. The stack 10 might then have a vertical dimension of 0.9 inches and width and depth dimensions of 1.9 inches. A typical active circuit chip size might be on the order of 0.6 inches, thus allowing about four chips to be carried by a component wafer. In order to determine the wafer area, i.e., cell size, required for a circuit chip, allowance should be made for as many free (unconnected) Z-axis slugs as are necessary to interconnect system wafer logic above and below the cell. Generally, about 1.5 free Z-axis slugs are needed for each chip terminal. An exemplary circuit strip with 44 leads, for example, would therefore need 44 × 2.5 = 110 Z-axis slugs for system interconnection. In a typical 12 by 12 matrix of slugs, 25 slugs, for example, may be aligned with the chips and therefore be unusable. The remaining 119 slugs would be available for circuit and system interconnection. The cell size required, therefore, is determined by the standardized 50-mil matrix of through-slugs and the factor 2.5 times the number of circuit leads. Assume that the 44-lead chip cell is 0.6 × 0.6 = 0.36 square inch in the plane of the wafer and 0.047 inch high. Since each chip has an average of two interconnection wafers associated with it, which may total 0.019 inch thick including the connector wafers and of the same cell area (0.36 inch square), the cell volume can be computed by multiplying cell area by the sum thicknesses of one interconnect wafer (typically, 0.019 inches), one component wafer (typically, 0.047 inches), and two connector screens (typically, 0.005 inches each), e.g., 0.36 × (0.019 + 0.047 + 0.010) = 0.0276 cubic inch/chip (36 chips/cubic inch).

Since a 44-lead MOS FEB chip may contain 100 gates or better, the circuit density in the wafer stack is typically 100/0.0276 = 3600 gates/cubic inch.

Although the foregoing specification has been primarily directed to a particular exemplary embodiment of the invention, it is to be understood that many variations and modifications may be made without departing from the scope of the invention as defined by the appended claims.

The embodiments of the invention in which an exclusive property or privilege is claimed are defined as follows:

1. A method of fabricating a plurality of spaced, electrically insulated through-connections in a predetermined pattern in a conductive sheet, said method comprising:

precision stamping one surface of said conductive sheet so as to form a plurality of closed path recesses therein defining a plurality of through-connection segments corresponding to said predetermined pattern, affixing dielectric material in the stamped closed path recesses, and removing a layer from the opposite surface of said conductive sheet of thickness sufficient to electrically isolate said through-connection segments from said sheet, said dielectric material serving to support the thus formed isolated through-connections in said sheet and electrically insulated therefrom.

2. The invention in accordance with claim 1, wherein the step of removing is accomplished by sanding.

3. The invention in accordance with claim 1, wherein the step of removing is accomplished by chemical etching.

4. The invention in accordance with claim 1, wherein said method additionally includes forming at least one electrically insulated conductor in said conductive sheet extending parallel thereto and following a predetermined path.

5. The invention in accordance with claim 4, wherein said electrically insulated conductor extending parallel to said sheet is formed by precision stamping additional recesses in said one surface shaped so as to define a conductor segment following said predetermined path and into which additional recesses dielectric material is likewise affixed, said additional recesses having a depth so that said conductor segment is likewise electrically isolated from said conductive sheet as a result of the removing of said layer from the opposite surface of said sheet and being likewise supported in said sheet and insulated therefrom by said dielectric material.

6. The invention in accordance with claim 5, wherein the forming of said conductor extending parallel to said wafer includes precision stamping second additional recesses of lesser depth in said one surface at locations corresponding to said conductor segment so as to recess the conductor segment from said one surface.

7. The invention in accordance with claim 6, wherein the forming of said conductor extending parallel to said wafer also includes recessing the opposite surface of said conductor segment from the surface of said sheet formed after removal of said layer so that the resulting conductor is recessed from both surfaces of said sheet.

8. The invention in accordance with claim 7, wherein the recessing of the opposite surface of said conductor segment is accomplished by selective chemical etching.

9. The invention in accordance with claim 8, wherein said method also includes affixing dielectric material in the recesses formed in the opposite surface of said conductor segment.

10. A method of fabricating a connector wafer for use in providing wafer-to-wafer electrical connections in a pressure-stacked multiwafer electrical structure, said method comprising:

providing a conductive wafer, precision stamping one surface of said conductive wafer so as to form a plurality of spaced closed path recesses therein defining a plurality of through-connection segments in a desired predetermined pattern as required for wafer-to-wafer interconnections in said multiwafer electrical structure, affixing dielectric material in the stamped closed path recesses, removing a layer from the opposite surface of said sheet of thickness sufficient to electrically isolate said through-connection segments from said wafer, said dielectric material serving to support the thus formed isolated through-connections in said sheet and electrically insulated therefrom, and forming a pressure-deformable contact of conductive material more malleable than said conductive wafer on at least one end of each of the isolated through-connection segments.

11. The invention in accordance with claim 10, wherein said method includes forming additional pressure-deformable contacts on at least one surface of said wafer at locations between said through-connections.

12. The invention in accordance with claim 11, wherein said through-connections and said additional pressure-deformable contacts are provided in a uniform pattern.

13. The invention in accordance with claim 11, wherein said method includes forming said uniform pattern of pressure-deformable contacts on both ends of said through-connection segments and on both surfaces of said wafer.

14. A method of fabricating a predetermined pattern of spaced, electrically insulated through-connections in a conductive sheet along with at least one insulated conductor wholly within the sheet extending parallel thereto and following a predetermined path, said method comprising:

precision stamping one surface of said conductive sheet so as to form first and second pluralities of recesses therein, said first plurality of recesses being shaped so as to define a plurality of through-connection segments corresponding to said predetermined pattern and said second plurality of recesses being shaped so as to define a conductor segment following said predetermined path, affixing dielectric material in each of said first and second pluralities of recesses, and removing a layer from the opposite surface of said sheet of thickness sufficient to electrically isolate said through-connection segments and said conductor segment from said sheet, said dielectric material serving to support the thus formed isolated through-connections and conductor in said sheet and electrically insulated therefrom.

15. The invention in accordance with claim 14, wherein said predetermined path of said conductor is chosen so that said conductor is electrically connected to at least one of said through-connections.

16. The invention in accordance with claim 14, wherein said method includes precision stamping additional recesses in said one surface of said wafer of lesser depth than said first and second pluralities of recesses at locations corresponding to said conductor segment so as to recess the conductor segment from said one surface.

17. The invention in accordance with claim 16, wherein said method includes recessing the opposite surface of said conductor segment from the surface of said sheet formed after removal of said layer so that the resulting conductor is recessed from both surfaces of said sheet.

* * * * *